(12) United States Patent
Sharad et al.

(10) Patent No.: US 8,830,771 B2
(45) Date of Patent: Sep. 9, 2014

(54) MEMORY DEVICE HAVING CONTROL CIRCUITRY CONFIGURED FOR CLOCK-BASED WRITE SELF-TIME TRACKING

(75) Inventors: Shailendra Sharad, Bangalore (IN); Manish Umedlal Patel, Bangalore (IN); Diwakar Ramadasu, Bangalore (IN); Setti Shanmukheswara Rao, Bangalore (IN)

(73) Assignee: LSI Corporation, San Jose, CA (US)

( * ) Notice: Subject to any disclaimer, the term of this patent is extended or adjusted under 35 U.S.C. 154(b) by 356 days.

(21) Appl. No.: 13/474,029

(22) Filed: May 17, 2012

(65) Prior Publication Data
US 2013/0308398 A1 Nov. 21, 2013

(51) Int. Cl.
*G11C 7/00* (2006.01)
*G11C 7/22* (2006.01)

(52) U.S. Cl.
USPC ............... 365/189.16; 365/210.1; 365/210.14

(58) Field of Classification Search
USPC ............................. 365/189.16, 210.1, 210.14
See application file for complete search history.

(56) References Cited

U.S. PATENT DOCUMENTS

| | | | |
|---|---|---|---|
| 6,192,003 B1 * | 2/2001 | Ohta et al. | 365/233.1 |
| 6,201,757 B1 | 3/2001 | Ward et al. | |
| 6,643,204 B1 | 11/2003 | Agrawal | |
| 6,738,296 B2 * | 5/2004 | Sung et al. | 365/189.07 |
| 7,016,245 B2 | 3/2006 | Balasubramanian et al. | |
| 7,499,347 B2 | 3/2009 | Chen et al. | |
| 7,646,658 B2 | 1/2010 | Chen et al. | |
| 2007/0165463 A1 | 7/2007 | Ahmad | |
| 2008/0080297 A1 * | 4/2008 | Starnes | 365/233.1 |

OTHER PUBLICATIONS

B.S. Amrutur et al., "A Replica Technique for Wordline and Sense Control in Low-Power SRAM's," IEEE Journal of Solid-State Circuits, Aug. 1998, pp. 1208-1219, vol. 33, No. 8.

* cited by examiner

*Primary Examiner* — Toan Le
(74) *Attorney, Agent, or Firm* — Ryan, Mason & Lewis, LLP

(57) ABSTRACT

A memory device includes a memory array comprising a including of memory cells, and control circuitry coupled to the memory array. The control circuitry includes write signal generation circuitry configured to provide a write clock signal for controlling writing of data to portions of the memory array, with timing of the write clock signal being determined at least in part utilizing a parallel combination of two or more additional memory cells external to the memory array. The parallel combination of additional memory cells may comprise a mini-array that includes centrally-located active memory cells surrounded by dummy memory cells. In an arrangement in which the write signal generation circuitry includes a clock latch, the parallel combination of additional memory cells may be coupled between a clock output of the clock latch and a reset input of the clock latch.

20 Claims, 6 Drawing Sheets

MEMORY DEVICE HAVING CONTROL CIRCUITRY CONFIGURED FOR CLOCK-BASED WRITE SELF-TIME TRACKING

BACKGROUND

A semiconductor memory device typically includes an array of memory cells arranged in rows and columns, with each memory cell configured to store a data bit. The memory cells within a given row of the array are coupled to a common wordline, while the memory cells within a given column of the array are coupled to a common bitline. Thus, the array includes a memory cell at each point where a wordline intersects with a bitline.

In a semiconductor memory device of the type described above, data may be written to or read from the memory cells of the array using a memory cycle that is divided into an active phase and a precharge phase, with the active phase being used to read or write one or more memory cells of the array and the precharge phase being used to precharge the bitlines to a precharge voltage in preparation for the next cycle. The precharge is an example of what is more generally referred to herein as "preset."

Reading a given memory cell generally comprises transferring data stored within that cell to its corresponding bitline, and writing a given memory cell generally comprises transferring data into that cell from its corresponding bitline. For a given read or write operation, the corresponding memory cycle is more particularly referred to as a read cycle or a write cycle, respectively.

A write self-time tracking arrangement may be used in order to establish appropriate signal timing for write operations. For example, a conventional arrangement of this type utilizes a dummy row of memory cells and a dummy column of memory cells, also referred to as a dummy wordline and a dummy bitline, respectively, with those memory cells being configured in the same manner as the actual memory cells of the memory array. A dummy wordline driver generates a dummy wordline signal for application to the dummy wordline with the same timing as an actual wordline signal applied to an actual wordline of the memory array. The dummy wordline and dummy bitline are also known as a self-time wordline (STWL) and a self-time bitline (STBL), respectively.

The signal delay of the dummy wordline due to its resistor-capacitor (RC) time constant matches the corresponding RC signal delay of the actual wordline of the memory array. Also, the wordline loading impact of the dummy column matches the wordline loading impact of an actual bitline of the memory array. The dummy wordline signal after passing through the entire length of the dummy wordline and being subject to its RC delay discharges the dummy bitline and triggers internal data nodes of a designated memory cell of the corresponding dummy column. The transition in those internal data nodes of the designated memory cell is detected in control circuitry and utilized to reset the wordline signals, thereby providing the write self-time tracking functionality.

Write self-time tracking functionality of the type described above is particularly important for high-speed write operations, such as those involving register files and other memories typically having write cycle frequencies in the gigahertz (GHz) range. However, it can be difficult under conventional arrangements to accurately control the write signal timing, particularly over expected process, voltage and temperature (PVT) variations. For example, the use of the dummy row and column arrangement can lead to undue delay in the start of a given write operation, while also introducing significant area overhead that is often unacceptable for registers and other small memories. As a result, write memory cycle time may be increased, thereby degrading memory write performance.

SUMMARY

Illustrative embodiments of the present invention provide a memory device comprising control circuitry configured for clock-based write self-time tracking. A given such embodiment can eliminate the need for a conventional dummy row and dummy column, as well as the associated dummy row driver, while also accurately tracking write behavior of the actual memory cells of the device.

In one embodiment, a memory device includes a memory array comprising a plurality of memory cells, and control circuitry coupled to the memory array. The control circuitry comprises write signal generation circuitry configured to provide a write clock signal for controlling writing of data to portions of the memory array, with timing of the write clock signal being determined at least in part utilizing a parallel combination of two or more additional memory cells external to the memory array.

By way of example, the parallel combination of additional memory cells may be operative to control a reset time of the write clock signal.

In an arrangement in which the write signal generation circuitry comprises a clock latch, the parallel combination of additional memory cells may be coupled between a clock output of the clock latch and a reset input of the clock latch.

The two or more additional memory cells may comprise respective active memory cells arranged in a central portion of a "mini-array" that also includes a plurality of dummy memory cells. The mini-array has dimensions that are substantially less than the corresponding dimensions of the actual memory array. The mini-array may comprise, for example, a 4×4 array with four active memory cells located in a central portion of the mini-array, or a 4×3 array with two active memory cells located in the central portion of the mini-array. In arrangements of this type, the active memory cells may be surrounded by dummy memory cells located in a peripheral portion of the mini-array.

The additional memory cells of the parallel combination may be coupled together at their respective first and second internal data nodes, which may correspond to respective true (T) and complemented (C) data nodes. More particularly, the first internal data nodes of the respective additional memory cells of the parallel combination may be coupled together to provide a first internal data node of the parallel combination and the second internal data nodes of the respective additional memory cells of the parallel combination may be coupled together to provide a second internal data node of the parallel combination. The first and second internal data nodes of the parallel combination of additional memory cells may have respective preset circuits associated therewith.

One or more of the illustrative embodiments can provide a memory device that exhibits shorter write memory cycles, reduced area overhead and lower power consumption, as well as improved overall operating performance, relative to conventional devices.

A memory device in accordance with embodiments of the invention may be implemented, for example, as a stand-alone memory device, such as a packaged integrated circuit, or as an embedded memory in a microprocessor or other processing device.

DETAILED DESCRIPTION

Embodiments of the invention will be illustrated herein in conjunction with exemplary semiconductor memory devices and associated control circuitry with clock-based write self-time tracking functionality. It should be understood, however, that embodiments of the invention are more generally applicable to any semiconductor memory device in which improvements in write performance are desired, and may be implemented using circuitry other than that specifically shown and described in conjunction with the illustrative embodiments.

Figure 1:
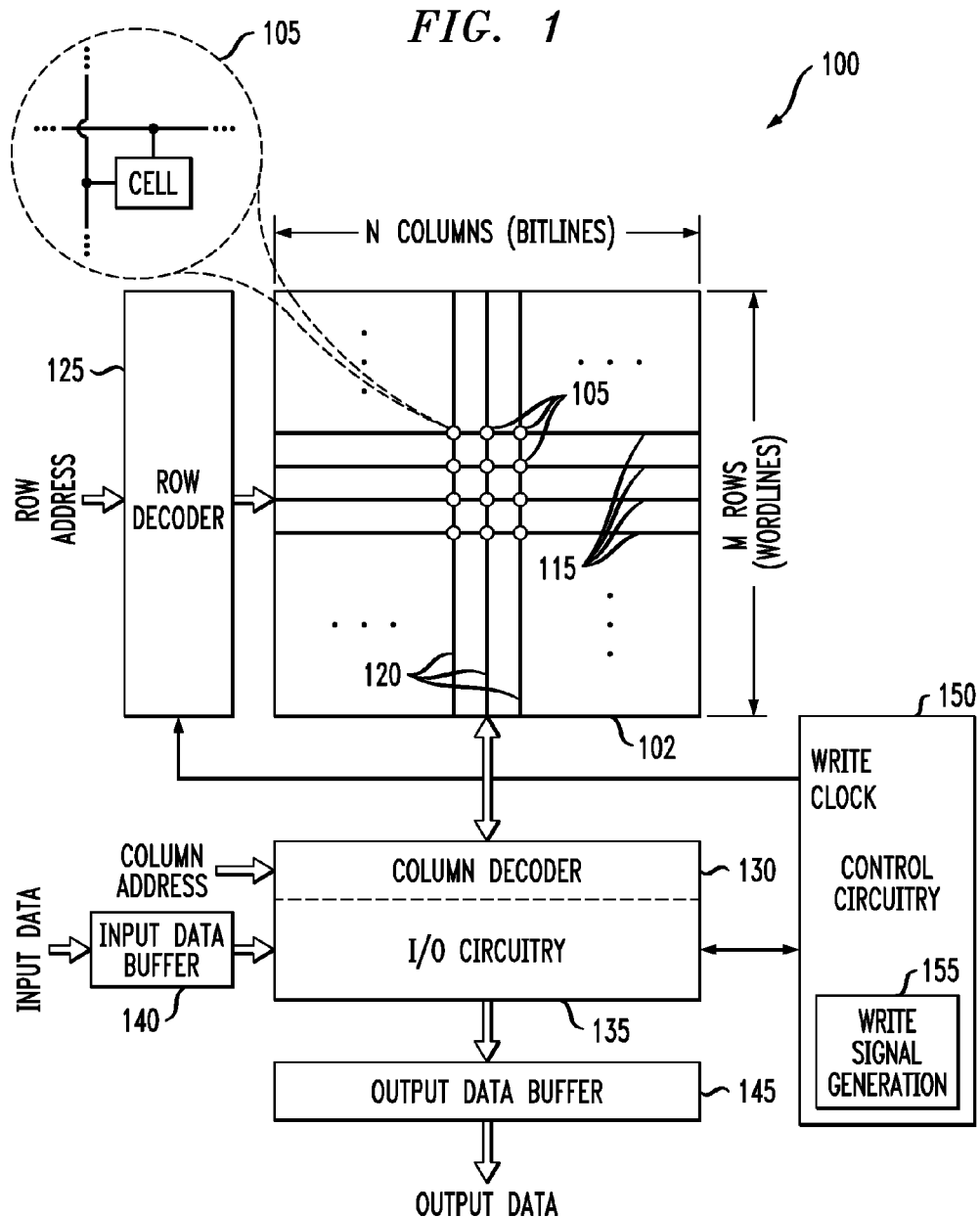
FIG. 1 shows a semiconductor memory device comprising a memory array having a plurality of memory cells and incorporating control circuitry with clock-based write self-time tracking functionality in an illustrative embodiment of the invention.

FIG. 1 shows a simplified diagram of a memory device 100 in accordance with an illustrative embodiment of the invention. The memory device 100 comprises a memory array 102. The memory array 102 comprises a plurality of memory cells 105 each configured to store a single bit of data. Such memory cells are also referred to herein as "bitcells." Each cell 105 is coupled to a corresponding row or wordline 115 and column or bitline 120. The memory array therefore includes a memory cell at each point where a wordline intersects with a bitline. The memory cells of the memory array are illustratively arranged in N columns and M rows. The values selected for N and M in a given implementation will generally depend upon on the data storage requirements of the application in which the memory device is utilized. In some embodiments, one of N and M may have value 1, resulting in an array comprising a single column or a single row of memory cells.

Particular ones of the memory cells 105 of the memory array 102 can be activated for writing data thereto or reading data therefrom by application of appropriate row and column addresses to respective row decoder 125 and column decoder 130. Other elements of the memory device 100 include input/output (I/O) circuitry 135, an input data buffer 140 and an output data buffer 145. The I/O circuitry 135 in the present embodiment is assumed by way of example to comprise sensing circuitry, such as differential sense amplifiers coupled to respective columns of the memory array 102. The operation of these and other memory device elements, such as row decoder 125, column decoder 130, and buffers 140 and 145, is well understood in the art and will not be described in detail herein.

Although memory array 102 is identified in FIG. 1 as comprising the cells 105 and their associated wordlines and bitlines 115 and 120, the term "memory array" as used herein is intended to be more broadly construed, and may encompass one or more associated elements such as the row and column decoders 125 and 130, the I/O circuitry 135, or the input and output data buffers 140 and 145, or portions thereof.

Also, the wordlines 115 and bitlines 120, although shown as respective single lines in FIG. 1, may each comprise separate read and write wordlines or bitlines. A given such read or write wordline or bitline may comprise a corresponding pair of differential lines, with such lines being denoted herein, for example, as a read bitline RBL and its complement RRLN, or a write bitline WBL and its complement WBLN.

In one or more embodiments to be described in conjunction with FIGS. 3 through 6, there is only a single read wordline RWL and a single write wordline NWWL, where RWL is active high and NWWL is active low. Numerous alternative arrangements of single or differential wordlines and bitlines may be used.

The memory device 100 in one or more of the illustrative embodiments may be assumed to comprise a static random access memory (SRAM) device. However, as indicated previously, the disclosed control circuitry for clock-based write self-timing can be adapted in a straightforward manner for use with other types of memory devices, including, for example, dynamic random access memory (DRAM), electrically erasable programmable ROM (EEPROM), magnetic RAM (MRAM), ferroelectric RAM (FRAM), phase-change RAM (PC-RAM), etc. Also, other types of memory cell configurations may be used. For example, the memory cells 105 in the memory array 102 could be multi-level cells each configured to store more than one bit of data. Embodiments of the invention are therefore not limited in terms of the particular storage or access mechanism utilized in the memory device.

The present embodiment of memory device 100 is configured to avoid one or more of the drawbacks of conventional practice through the use of control circuitry 150 that includes write signal generation circuitry 155 configured to provide a write clock signal for controlling writing of data to portions of the memory array 102. As will be described in greater detail below in conjunction with FIGS. 2 through 5, timing of the write clock signal generated by the write signal generation circuitry 155 is determined at least in part utilizing a parallel combination of two or more additional memory cells external to the memory array 102. The set of parallel-connected additional memory cells in the FIG. 2 embodiment is part of what is referred to as a "mini-array" of active and dummy memory cells. Such an arrangement can advantageously eliminate the need for a conventional dummy row and dummy column, as well as the associated dummy row driver, while ensuring that write behavior of the actual memory cells 105 of the memory array 102 is accurately tracked.

The memory device 100 as illustrated in FIG. 1 may include other elements in addition to or in place of those specifically shown, including one or more elements of a type commonly found in a conventional implementation of such a memory device. These and other conventional elements, being well understood by those skilled in the art, are not described in detail herein. It should also be understood that the particular arrangement of elements shown in FIG. 1 is presented by way of illustrative example only. Those skilled in the art will recognize that a wide variety of other memory device configurations may be used in implementing embodiments of the invention.

Figure 2:
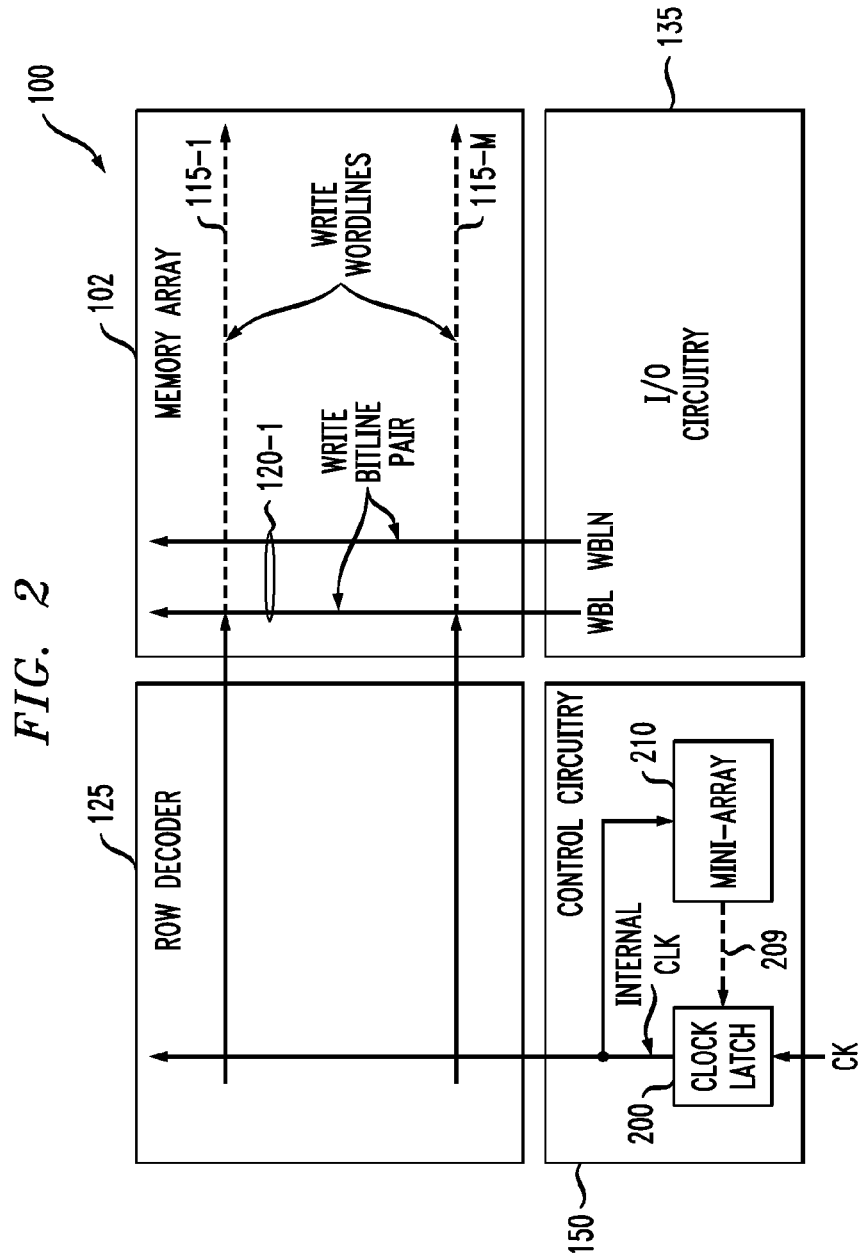
FIG. 2 shows a more detailed view of a portion of the FIG. 1 memory device.

Referring now to FIG. 2, a more detailed view of the FIG. 1 memory device 100 is shown. In this embodiment, the memory array 102 includes N pairs of write bitlines 120-1 through 120-N, with one such pair associated with each column of the memory array, and each pair comprising a write bitline WBL and its complement WBLN. The memory array 102 also includes write wordlines 115-1 through 115-M, each of which may be implemented as a single active low write wordline NWWL. The row decoder 125 provides write signals to the respective write wordlines 115-1 through 115-M in conjunction with the writing of input data from write bitlines 120 to corresponding rows of the memory array 102. Such write signals and the associated write operations directed to memory array 102 are controlled based at least in part on a write clock signal generated by the control circuitry 150.

The write clock signal in this embodiment comprises an internal clock generated by a clock latch 200 within the control circuitry 150. The clock latch 200 in the present embodiment utilizes an input clock denoted CK to generate the write clock signal for application to the row decoder 125 associated with the memory array 102. A mini-array 210 comprising at least one set of parallel-connected memory cells is coupled between the write clock output of the clock latch and a reset input 209 of the clock latch. The mini-array 210 is utilized to generate a reset signal for application to the reset input 209 of the clock latch 200. The reset signal controls a reset time of the write clock signal generated by the clock latch 200.

The mini-array 210 in the present embodiment comprises at least two additional memory cells combined in parallel with their respective internal data nodes connected together. More particularly, first internal data nodes of the respective additional memory cells of the parallel combination are coupled together to provide a first internal data node of the parallel combination and second internal data nodes of the respective additional memory cells of the parallel combination are coupled together to provide a second internal data node of the parallel combination. The first and second internal data nodes of both the individual additional memory cells and the parallel combination of such cells are illustratively designated herein as T and C, for true and complementary, respectively.

As a more particular example, the mini-array 210 may comprise four additional active memory cells with their respective first internal data nodes connected together and their respective second internal data nodes connected together, as well as multiple dummy memory cells. An arrangement of this type will be described in more detail below in conjunction with FIG. 4.

Each of the parallel-connected memory cells of the mini-array 210 is generally configured in substantially the same manner as the memory cells 105 of the memory array 102, so as to exhibit data transition times that accurately track data transition times of the memory cells of the memory array. Multiple parallel-connected memory cells are used in the mini-array in order to reduce statistical variation in their individual data transition times, while associated dummy memory cells of the mini-array are used to simulate signal line loading within the actual memory array.

By providing such a mini-array with parallel-connected memory cells arranged between a clock output and a reset input of the clock latch 200, write time can be more accurately controlled over PVT variations, thereby facilitating high-speed write operations in the memory device 100. This advantageous effect is achieved without the need for dummy row, dummy column and dummy row driver components, and thus with reduced area overhead relative to conventional write self-time tracking approaches. Also, excessive delay overhead attributed to the dummy row and column is eliminated, which can provide a significant reduction in memory array write times.

Figure 3:
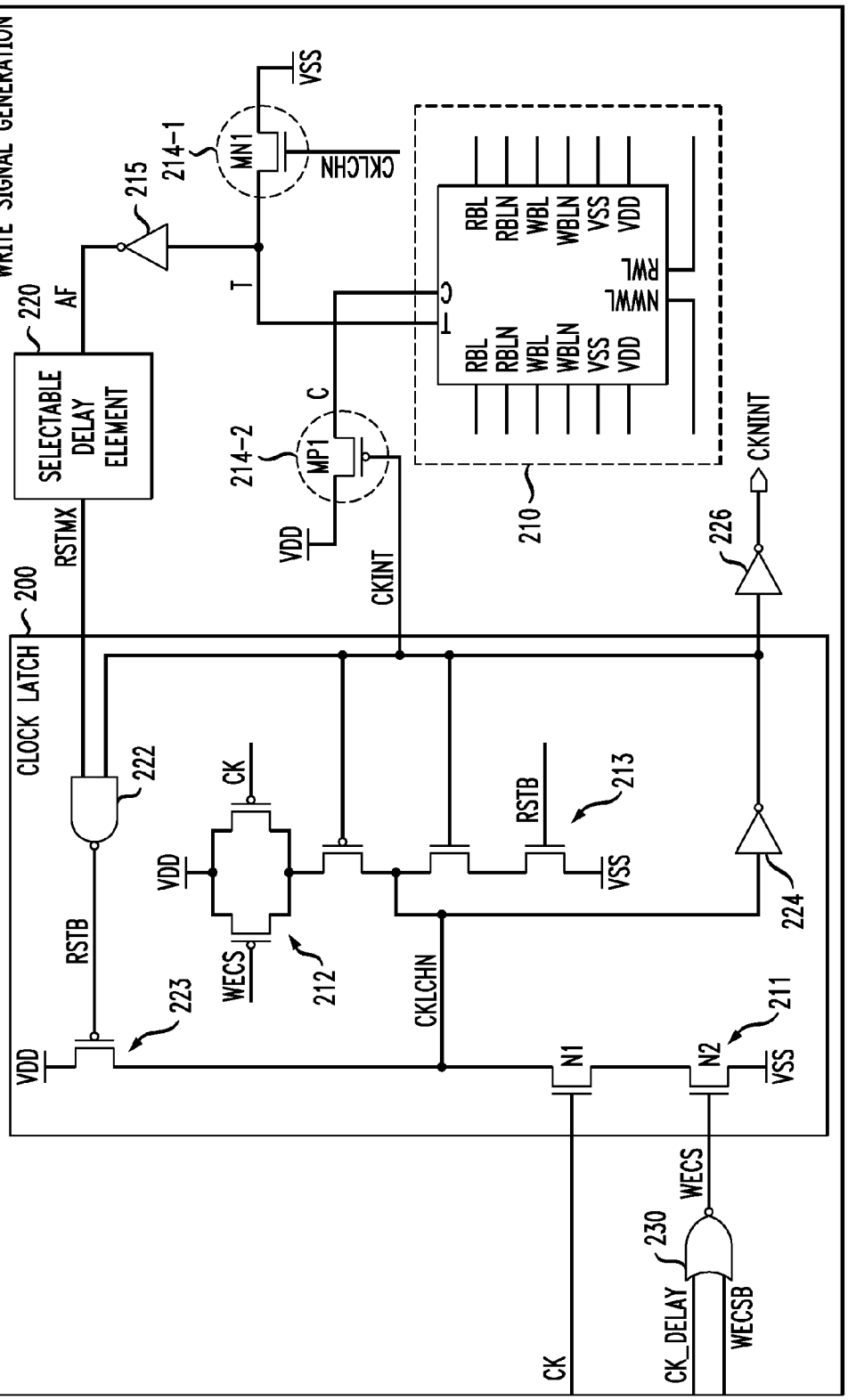
FIG. 3 illustrates exemplary write signal generation circuitry of the FIG. 1 memory device.

A more detailed view of the write signal generation circuitry 155 is shown in FIG. 3. The write signal generation circuitry 155 in this embodiment comprises clock latch 200 and mini-array 210 as previously described, and further includes sets of MOS circuitry 211, 212, 213 and 214, an inverter 215, a selectable delay element 220, a NAND gate 222, MOS circuitry 223, inverters 224 and 226, and a NOR gate 230.

Figure 4:
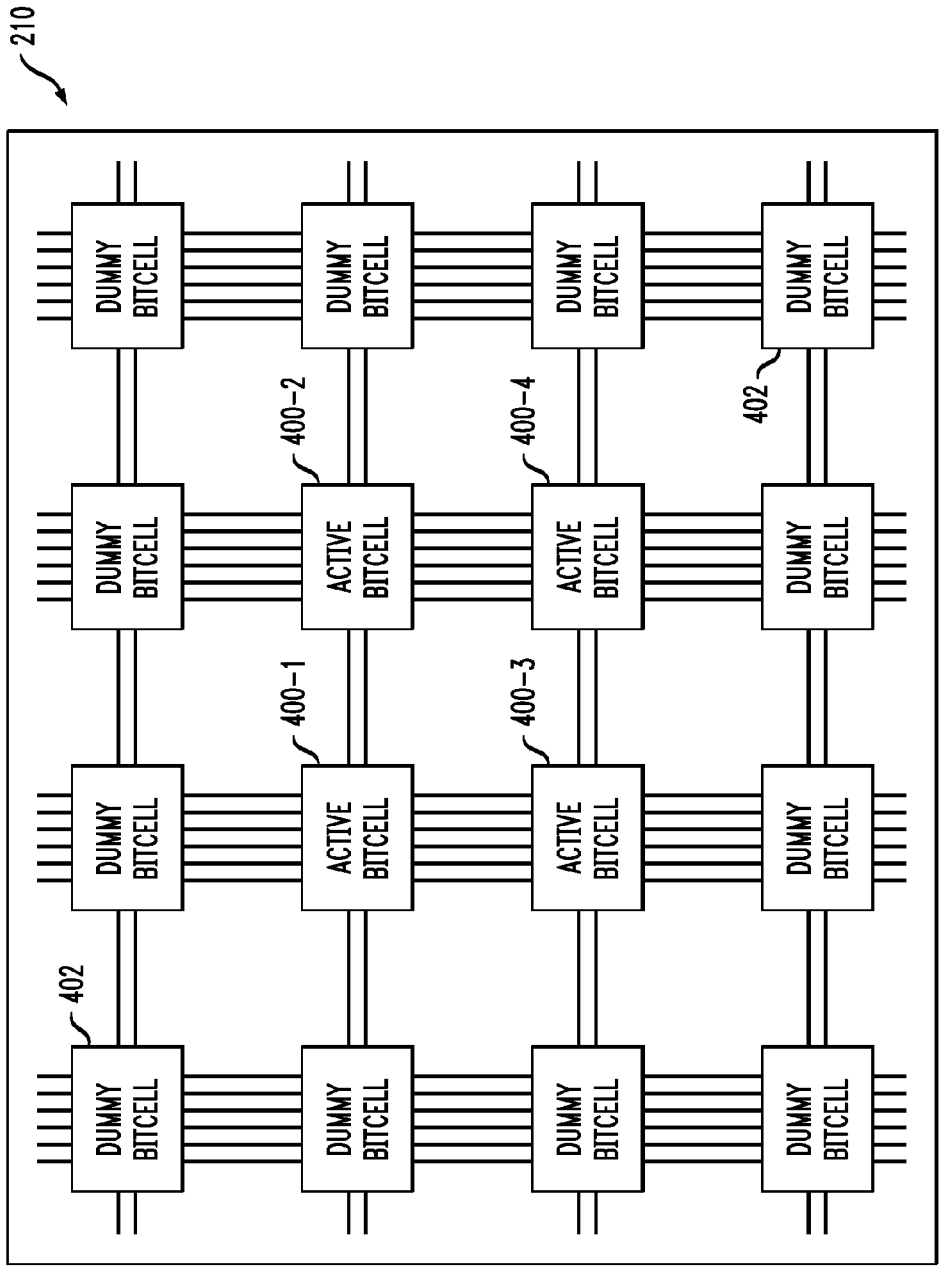
FIG. 4 shows one possible arrangement of a set of parallel-connected memory cells implemented in the write signal generation circuitry of FIG. 3.

The mini-array 210 in the present embodiment is assumed by way of example to comprise four active memory cells that are combined in parallel with one another and arranged in a central portion of the mini-array, as illustrated in FIG. 4. A first internal data node T of the parallel combination corresponds to the connected internal data nodes T of the individual active memory cells of the mini-array, and a second internal data node C of the parallel combination corresponds to the connected internal data nodes C of the individual active memory cells of the mini-array.

The mini-array 210 is also coupled to additional signal lines, including read bitline RBL and its complement RBLN, write bitline WBL and it complement WBLN, read wordline RWL, active low write wordline NWWL, as well as upper and lower supply voltages VDD and VSS, as indicated in FIG. 3. The read wordline RWL is also shown as being coupled to a signal line denoted SPWR0.

Associated with the first and second internal data nodes T and C of the parallel-connected memory cells are respective first and second preset circuits 214-1 and 214-2. The input and output preset circuits 214-1 and 214-2 are operative to preset respective nodes T and C to respective logic levels of "0" and "1" prior to the start of a given memory cycle.

The first preset circuit 214-1 more particularly comprises an n-type MOS (NMOS) transistor MN1 having its gate adapted to receive a clock latch signal CKLCHN of the clock latch 200, its drain coupled to the internal data node T of the parallel-connected memory cells, and its source coupled to a lower supply voltage VSS. Similarly, the second preset circuit 214-2 in the present embodiment comprises a p-type MOS (PMOS) transistor MP1 having its gate adapted to receive an internal clock signal CKINT generated by the clock latch 200, its drain coupled to the internal data node C of the parallel-connected memory cells, and its source coupled to an upper supply voltage VDD.

The NMOS and PMOS transistors of the preset circuits 214 may be sized in a manner that minimizes loading on the internal data nodes T and C. For example, transistor widths on the order of about 0.1 to 0.2 micrometers (μm) may be used, although numerous other transistor configurations may be used in other embodiments.

The internal data node T of the parallel-connected memory cells of the mini-array 210 is coupled via inverter 215 to an input of the selectable delay element 220. The selectable delay element is an example of what is more generally referred to herein as "delay adjustment circuitry" that is coupled between an internal data node of the parallel combination of additional memory cells and the reset input of the clock latch 200. The selectable delay element in the present embodiment is configured to select between multiple delays for the reset path in order to adjust write margin. As a more particular example, a 3-to-1 multiplexer may be used to select one of three available delays, possibly in conjunction with testing of the memory device 100, although numerous alternative arrangements can be used. In embodiments without a selectable delay element, one or more inverters may be used in its place. The input of the selectable delay element 220 is denoted AF in the diagram, and its output provides a reset signal RSTMX to the reset input of the clock latch 200.

The inverter 215 may include transistors of medium size, with PMOS and NMOS widths Wp/Wn in the range of about 0.3/0.2 μm to 0.5/0.3 μm. Again, other transistor configurations may be used.

The clock latch 200 generates the above-noted CKINT and CKLCHN signals from the input clock signal CK. The CK signal is applied to a gate of a first NMOS transistor N1 of the MOS circuitry 211, and the CKLCHN signal is provided at the drain of that NMOS transistor. A clock delay input signal CK_DELAY is applied to one of the inputs of the NOR gate 230, a signal WECSB that is complementary to a write enable signal of the memory array 102 is applied to the other input of the NOR gate 230, and the output of NOR gate 230 drives the gate of a second NMOS transistor N2 of the MOS circuitry 211. The output of NOR gate 230 is a signal WECS that is also applied to a gate of a PMOS transistor of the MOS circuitry 212. If the write enable signal is low, WECS remains low and a write clock signal will not be generated by the clock latch 200. The CK_DELAY signal is a delayed version of the input clock signal CK, and may be delayed by about four inverter delays relative to CK, although other delay values could be used.

The CKLCHN signal is applied to a common node between the MOS circuitry 212 and 213 and to an input of inverter 224. The output of the inverter 224 provides the CKINT signal, which is also applied to an input of inverter 226. The output of inverter 226 provides the complementary clock signal CKNINT. The CKINT signal is also fed back to gate terminals of respective PMOS and NMOS transistors in the MOS circuitry 212 and 213.

The reset input of the clock latch 200 drives one input of the NAND gate 222, and the other input of the NAND gate 222 receives the CKINT signal from the output of inverter 224. The output of the NAND gate is denoted RSTB and is applied to a gate terminal of a PMOS transistor of MOS circuitry 223.

As indicated previously, prior to a given write cycle, the internal data nodes T and C of the parallel-connected memory cells of the mini-array 210 are preset to respective "0" and "1" logic levels. When the clock signal CK goes high, CKLCHN goes low which starts the write operation to the parallel-connected memory cells of the mini-array 210 such that data node T begins to pull up to a logic "1" level. This transition on data node T is detected by inverter 215 and causes RSTB to go low, which in turn causes CKLCHN to go high. At the end of each write cycle, the preset transistors MN1 and MP1 of the respective preset circuits 214-1 and 214-2 restore the T and C nodes of the parallel-connected memory cells of the mini-array 210 back to respective "0" and "1" logic levels.

Figure 5:
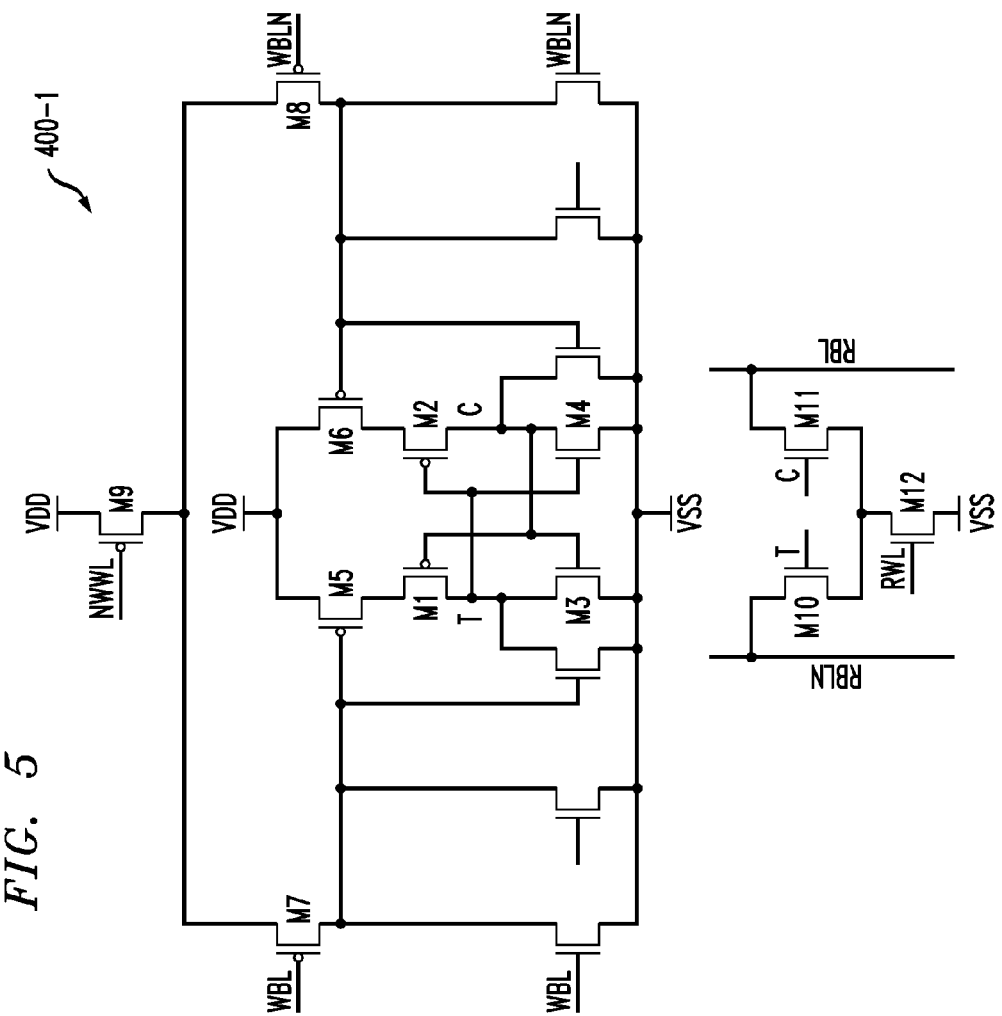
FIG. 5 is a schematic diagram of an exemplary memory cell in the set of parallel-connected memory cells of FIG. 4.

The mini-array 210 is configured in this embodiment to utilize a two-port memory cell in which the write port is separated from the read port, and the write wordline is active low, and denoted as NWWL. An example of a memory cell of this type is shown in FIG. 5. A write into this memory cell is initiated by CKLCHN going low. The CKLCHN signal line therefore controls wordline NWWL for writing to the active memory cells of the mini-array 210, as indicated in FIG. 3. The CKNINT signal is utilized to control timing of write wordline signals generated by the row decoder 125 for writing data into selected memory cells 105 of the memory array 102.

The write bitlines WBL and WBLN of the parallel-connected memory cells of the mini-array 210 are configured such that a write of a logic "1" corresponds generally to a worst-case data transition of the memory cells 105. The devices MN1 and MP1 turn off well before the memory cell 105 data transition starts. During reset, node C first goes low and then node T goes high, which is detected by inverter 215. The inverter 215 is configured with a high trip point so as to track worst-case write time in the memory cell 105. The worst-case write time is reflected in delay from CKLCHN to AF which further controls the reset delay and thereby the pulse width of the write wordline signals generated by row decoder 125.

After AF goes low, RSTMX goes high and RSTB goes low, which in turn pulls up the CKLCHN signal, and after a buffer delay CKNINT goes high. Then, after address latch and row decoder delays, the write wordline is turned off. As a result, the write wordline pulse width is given by the tracked data transition time plus a logic delay. The CKLCHN signal turns on MN1 to preset the T node to a logic "0" level and the CKINT signal turns on MP1 to preset the C node to a logic "1" level, in preparation for the next write cycle.

FIG. 4 shows one example of the mini-array 210 configured to include four active memory cells 400-1, 400-2, 400-3 and 400-4, surrounded by dummy memory cells 402 to form a 4×4 array. As noted above, such memory cells are also referred to herein as "bitcells." In other embodiments, other types of mini-arrays can be used. For example, the mini-array may comprise a 4×3 array with two active cells in the center of the array. These 4×4 or 4×3 arrangements are examples of arrangements in which active memory cells are arranged in a central portion of a mini-array that also includes a plurality of dummy memory cells arranged in a peripheral portion of the mini-array.

The two horizontal lines passing through the bitcells 400 and 402 in a given row of the mini-array 210 in FIG. 4 illustratively comprise the read wordline RWL and the write wordline NWWL. The six vertical lines passing through the bitcells 400 and 402 in a given column of the mini-array 210 in FIG. 4 illustratively comprise read bitline RBL and its complement RBLN, write bitline WBL and its complement WBLN, the upper supply voltage VDD and the lower supply voltage VSS.

Although not expressly indicated in FIG. 4, the T nodes of the respective active memory cells 400-1 through 400-4 are all connected together, as described previously. Similarly, the C nodes of the respective active memory cells 400-1 through 400-4 are all connected together, also as described previously. The other signal lines associated with these four active memory cells are also connected together, such that the active cells are fully connected in parallel with one another. Other types of parallel connection of multiple memory cells may be used in other embodiments.

It should be noted that the dummy memory cells 402 are not connected in parallel with one another or with the active cells in the present embodiment. Moreover, the signal lines NWWL and RWL for the dummy memory cells 402 are connected to the dummy memory cells in such a way that these dummy memory cells cannot support a read operation or a write operation. For example, in the dummy memory cells, NWWL and RWL may be connected to SPWR1 and SPRW0 signal lines, respectively, so that these dummy cells do not go into either a write mode or a read mode. The SPWR1 and SPWR0 signal lines in the present embodiment are internally-generated soft-VDD and soft-VSS signal lines, respectively, that are logically the same as VDD and VSS. The use of SPWR1 and SPWR0 signal lines avoids direct connection of VDD and VSS to any gate terminal. These signal lines may be coupled to VDD and VSS via transistor resistors comprising respective PMOS and NMOS devices that are configured in their on states.

In general, the mini-array will comprise at least two parallel-connected memory cells. It should be noted that, although the mini-array 210 in the FIG. 4 embodiment comprises dummy memory cells arranged in rows and columns, the dimensions of the mini-array are very small and therefore the area overhead savings is significant compared to conventional arrangements that include a dummy row and a dummy column of respective lengths given by the corresponding full dimensions of the actual memory array.

Referring now to FIG. 5, an example of a given one of the active memory cells 400-1 of the mini-array 210 is shown. As noted above, the memory cell in this embodiment is a two-port memory cell, comprising a write port and a read port, in which the write port is separated from the read port and the write wordline NWWL is active low. A memory cell of this type may be utilized in a register file, for example, or other type of high-speed memory.

The memory cell 400-1 comprises MOS circuitry including transistors M1 through M12, as well as additional transistors arranged as shown. PMOS transistor M1 and NMOS transistor M3 form a first inverter and PMOS transistor M2 and NMOS transistor M4 form a second inverter. The inverters are cross-coupled to one another at the internal data nodes T and C. PMOS transistors M5 and M6 are coupled between M1 and M2, respectively, and the upper voltage supply VDD. The write port utilizes PMOS transistors M7 and M8 to couple WBL and WBLN, respectively, to the memory cell. The active low write wordline NWWL is coupled to the gate of PMOS transistor M9. The read port comprises NMOS transistors M10 and M11 coupled between respective internal data nodes T and C and RBLN and RBL, and NMOS transistor M12 having its gate coupled to RWL. The FIG. 5 memory cell is exemplary only, and numerous other types of memory cells may be used in implementing embodiments of the invention.

As mentioned previously, the control circuitry arrangements described in conjunction with FIGS. 2 through 5 avoid the need for dummy row, dummy column and dummy row driver components, and thus exhibit reduced area overhead relative to conventional write self-time tracking approaches. Also, write times are reduced by eliminating excessive delay overhead associated with the dummy row and dummy column, leading to improved high-speed operation of the memory device.

It is to be appreciated that the particular control circuitry shown in the embodiments of FIGS. 2 through 5 is presented by way of illustration only, and a wide variety of other types of control circuitry may be utilized in other embodiments of the present invention. For example, in one or more of these other embodiments, the conductivity types of at least a subset of the PMOS and NMOS transistors may be reversed, and other suitable modifications may be made to the control circuitry and associated signaling levels, as would be appreciated by one skilled in the art. Also, other types of write signal generation circuitry and other memory device components may be used in implementing other embodiments.

Embodiments of the present invention are particularly well suited for use in high-speed SRAMs and DRAMs, as well as other types of memories that demand high write speeds, such as content-addressable memories (CAMs) and processor register files.

A given memory device configured in accordance with an embodiment of the present invention may be implemented as a stand-alone memory device, for example, as a packaged integrated circuit memory device suitable for incorporation into a higher-level circuit board or other system. Other types of implementations are possible, such as an embedded memory device, where the memory may be, for example, embedded into a processor or other type of integrated circuit device which comprises additional circuitry coupled to the memory device. More particularly, a memory device as described herein may comprise, for example, an embedded memory implemented within a microprocessor, digital signal processor (DSP), application-specific integrated circuit (ASIC), field-programmable gate array (FPGA) or other type of processor or integrated circuit device.

Figure 6:
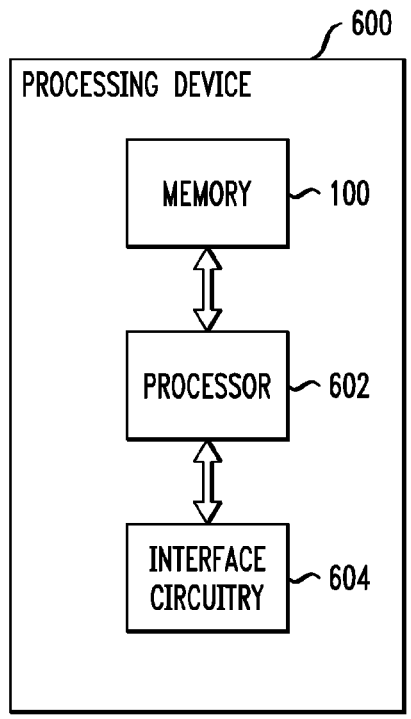
FIG. 6 is a block diagram of a processing device which incorporates the memory device of FIG. 1.

FIG. 6 shows an embodiment of a processing device 600 which incorporates the memory device 100 of FIG. 1. In this embodiment, the memory device 100 is coupled to a processor 602. The processing device further includes interface circuitry 604 coupled to the processor 602. The processing device 600 may comprise, for example, a computer, a server or a portable communication device such as a mobile telephone. The interface circuitry 604 may comprise one or more transceivers for allowing the device 600 to communicate over a network.

Figure 7:
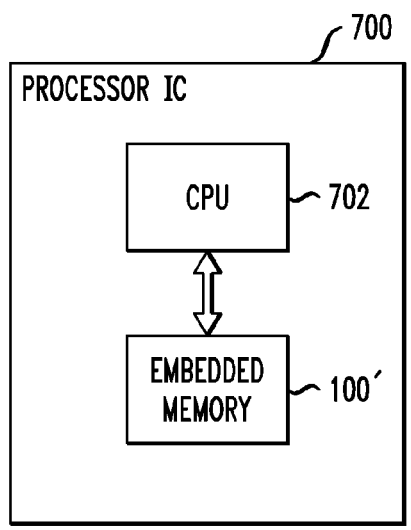
FIG. 7 is a block diagram of a processor integrated circuit which incorporates the memory device of FIG. 1 as an embedded memory.

Alternatively, processing device 600 may comprise a microprocessor, DSP or ASIC, with processor 602 corresponding to a central processing unit (CPU) and memory device 100 providing at least a portion of an embedded memory of the microprocessor, DSP or ASIC. FIG. 7 shows an example of an arrangement of this type, with processor integrated circuit 700 incorporating the memory device of FIG. 1 as an embedded memory 100'. The embedded memory 100' in this embodiment is coupled to a CPU 702. The embedded memory may comprise, for example, a high-speed register file. Numerous alternative embedded memory embodiments are possible.

As indicated above, embodiments of the invention may be implemented in the form of integrated circuits. In fabricating such integrated circuits, identical die are typically formed in a repeated pattern on a surface of a semiconductor wafer. Each die includes a memory device with control circuitry as described herein, and may include other structures or circuits. The individual die are cut or diced from the wafer, and packaged as integrated circuits. One skilled in the art would know how to dice wafers and package die to produce integrated circuits. Integrated circuits so manufactured are considered embodiments of this invention.

Again, it should be emphasized that the above-described embodiments of the invention are intended to be illustrative only. For example, other embodiments can use different types and arrangements of memory arrays, mini-arrays, memory cell circuitry, control circuitry, write signal generation circuitry, transistor conductivity types, control signals, and other elements for implementing the described write self-time tracking functionality. These and numerous other alternative embodiments within the scope of the following claims will be apparent to those skilled in the art.

What is claimed is:

1. A memory device comprising:
a memory array comprising a plurality of memory cells; and
control circuitry coupled to the memory array;
the control circuitry comprising:
write signal generation circuitry comprising a parallel combination of two or more additional memory cells external to the memory array;
the write signal generation circuitry being configured to provide a write clock signal for controlling writing of data to portions of the memory array wherein timing of the write clock signal is determined at least in part utilizing the parallel combination of two or more additional memory cells external to the memory array.

2. The memory device of claim 1 wherein the parallel combination of additional memory cells is operative to control a reset time of the write clock signal.

3. The memory device of claim 1 wherein the write signal generation circuitry comprises a clock latch.

4. The memory device of claim 3 wherein the parallel combination of additional memory cells is coupled between a clock output of the clock latch and a reset input of the clock latch.

5. The memory device of claim 4 wherein the write signal generation circuitry further comprises delay adjustment circuitry coupled between the parallel combination of additional memory cells and the reset input of the clock latch.

6. The memory device of claim 3 wherein the clock latch comprises:
   a clock output providing the write clock signal to a row decoder associated with the memory array;
   a clock input adapted to receive an input clock signal; and
   a reset input receiving a reset signal controlled at least in part by the parallel combination of additional memory cells.

7. The memory device of claim 1 wherein the parallel combination of additional memory cells comprises at least two additional memory cells each having a first internal data node and a second internal data node, with the first internal data nodes being coupled together and the second internal data nodes being coupled together.

8. The memory device of claim 7 wherein said at least two additional memory cells comprise respective active memory cells arranged in a central portion of a mini-array and wherein the mini-array further comprises a plurality of dummy memory cells arranged in a peripheral portion of the mini-array.

9. The memory device of claim 1 wherein the additional memory cells are configured to track a data transition time of the memory cells of the memory array.

10. The memory device of claim 9 wherein first internal data nodes of the respective additional memory cells of the parallel combination are coupled together to provide a first internal data node of the parallel combination and second internal data nodes of the respective additional memory cells of the parallel combination are coupled together to provide a second internal data node of the parallel combination.

11. The memory device of claim 10 wherein the parallel combination of additional memory cells has first and second preset circuits associated therewith, each configured to preset a corresponding one of the first and second internal data nodes of the parallel combination.

12. The memory device of claim 11 wherein the first preset circuit comprises a MOS transistor having its gate coupled to an output of a clock latch that generates the write clock signal and one of its source and its drain coupled to the first internal data node of the parallel combination of additional memory cells.

13. The memory device of claim 11 wherein the second preset circuit comprises a MOS transistor having its gate coupled to an output of a clock latch that generates the write clock signal and one of its source and its drain coupled to the second internal data node of the parallel combination of additional memory cells.

14. An integrated circuit comprising the memory device of claim 1.

15. A processing device comprising the memory device of claim 1.

16. A method comprising:
   generating a write clock signal for controlling writing of data to portions of a memory array comprising a plurality of memory cells; and
   controlling timing of the write clock signal at least in part utilizing a parallel combination of two or more additional memory cells external to the memory array.

17. The method of claim 16 wherein the controlling step comprises controlling a reset time of the write clock signal using the parallel combination of additional memory cells.

18. The method of claim 16 wherein the controlling step comprises adjusting an amount of delay between a designated internal data node of the parallel combination of additional memory cells and a reset input of a clock latch that generates the write clock signal.

19. The method of claim 16 further including the step of presetting first and second internal data nodes of the parallel combination of additional memory cells.

20. An apparatus comprising:
   control circuitry adapted for coupling to a memory array comprising a plurality of memory cells;
   the control circuitry comprising write signal generation circuitry including a parallel combination of two or more additional memory cells;
   wherein the write signal generation circuitry is configured to provide a write clock signal for controlling writing of data to portions of the memory array wherein timing of the write clock signal is determined at least in part utilizing the parallel combination of two or more additional memory cells.

* * * * *